(12) United States Patent
Arnz et al.

(10) Patent No.: US 10,012,911 B2
(45) Date of Patent: Jul. 3, 2018

(54) PROJECTION EXPOSURE APPARATUS WITH WAVEFRONT MEASURING DEVICE AND OPTICAL WAVEFRONT MANIPULATOR

(71) Applicant: Carl Zeiss SMT GmbH, Oberkochen (DE)

(72) Inventors: Michael Arnz, Oberkochen (DE); Sascha Bleidistel, Aalen (DE); Toralf Gruner, Aalen-Hofen (DE); Joachim Hartjes, Aalen (DE); Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/618,395

(22) Filed: Jun. 9, 2017

(65) Prior Publication Data

US 2017/0336714 A1   Nov. 23, 2017

Related U.S. Application Data

(63) Continuation of application No. PCT/EP2015/080087, filed on Dec. 16, 2015.

(30) Foreign Application Priority Data

Dec. 17, 2014   (DE) .................. 10 2014 226 269

(51) Int. Cl.
  *G03B 27/68*   (2006.01)
  *G03F 7/20*   (2006.01)

(52) U.S. Cl.
  CPC .......... *G03F 7/706* (2013.01); *G03F 7/70266* (2013.01)

(58) Field of Classification Search
  CPC ... G03F 7/706; G03F 7/70266; G03F 7/70075
  (Continued)

(56) References Cited

U.S. PATENT DOCUMENTS 5,062,705 A    11/1991  Sato et al.
5,767,959 A *   6/1998  Kobayashi ......... G01M 11/0264
                                               356/124

(Continued)

FOREIGN PATENT DOCUMENTS

DE       690 14 180 T2    4/1995
DE    10 2005 026 628 A1   12/2005
(Continued)

OTHER PUBLICATIONS

International Search Report and Written Opinion for corresponding PCT Appl No. PCT/EP2015/080087, dated Apr. 19, 2016.

*Primary Examiner* — Hung Henry Nguyen
(74) *Attorney, Agent, or Firm* — Fish & Richardson P.C.

(57) ABSTRACT

A projection exposure apparatus includes a projection lens, a wavefront manipulator and a wavefront measuring device for measuring a wavefront in the projection lens. The wavefront measuring device includes a Moiré grating arrangement having an object grating and an image grating which are designed to be arranged in an object plane and an image plane, respectively, of the projection lens. The object grating and the image grating are coordinated with one another in a manner true to scale in such a way as to generate a Moiré superimposition pattern from an imaging of the object grating onto the image plane and the image grating. The Moiré grating arrangement is designed in such a way as to simultaneously generate the Moiré superimposition pattern for a plurality of field points of an object field in the object plane and/or of an image field in the image plane.

20 Claims, 5 Drawing Sheets

(58) Field of Classification Search
USPC .................................. 355/52, 53, 55, 67–71
See application file for complete search history.

(56) References Cited

U.S. PATENT DOCUMENTS

| | | | |
|---|---|---|---|
| 7,268,890 B2 * | 9/2007 | Emer | .................. G03F 7/706 |
| | | | 356/515 |
| 2005/0122506 A1 | 6/2005 | Wegmann | |
| 2005/0200940 A1 | 9/2005 | Emer | |
| 2005/0264827 A1 | 12/2005 | Schriever et al. | |
| 2006/0012799 A1 | 1/2006 | Wegmann | |

FOREIGN PATENT DOCUMENTS

| | | |
|---|---|---|
| DE | 10 2006 059 823 A1 | 6/2008 |
| DE | 10 2013 204 391 B3 | 5/2014 |
| WO | WO 2014/139719 A1 | 9/2014 |

\* cited by examiner

PROJECTION EXPOSURE APPARATUS WITH WAVEFRONT MEASURING DEVICE AND OPTICAL WAVEFRONT MANIPULATOR

CROSS-REFERENCE TO RELATED APPLICATIONS

The present application is a continuation of, and claims benefit under 35 USC 120 to, international application PCT/EP2015/080087, filed Dec. 16, 2015, which claims benefit under 35 USC 119 of German Application No. 10 2014 226 269.0, filed Dec. 17, 2014. The entire disclosure of international application PCT/EP2015/080087 and German Application No. 10 2014 226 269.0 are incorporated by reference herein

FIELD

The disclosure relates to a projection exposure apparatus having a projection lens and an optical wavefront manipulator, as well as related methods.

BACKGROUND

A wavefront measuring device is known from DE 10 2005 026 628 A1.

A wavefront measuring device is used in a projection exposure apparatus for microlithography. Microlithography is one of the central technologies in semiconductor and microsystems engineering and serves for producing integrated circuits, semiconductor components and further electronic products. The basic concept of microlithography consists in transferring predefined structures to a substrate, for example a silicon wafer, via one or a plurality of exposure processes. The predefined structures typically contain micro- and/or nanostructures, formed on a reticle (also known as a photomask or mask). The substrate (wafer) is coated with a light-sensitive material (photoresist). During exposure, the exposure light is guided to the projection lens via the reticle, wherein the exposure light, after passing through the projection lens, finally reaches the substrate, where it acts on the light-sensitive material. In the subsequent development step, the substrate is treated with a solvent, such that, after the treatment, only the regions of the substrate surface which correspond to the predefined structures of the reticle are covered by the light-sensitive material; or, conversely, such that such regions become free.

Finally, the predefined structures of the reticle are transferred to the substrate in an etching step in which photoresist-free regions of the substrate surface are removed by an etching solution.

In semiconductor engineering it is desirable to realize structures having the smallest possible dimensions, in order to increase the number of circuits and/or semiconductor components that can be integrated on an area unit and thus to increase the performance of the semiconductor components. The structure size that can be realized microlithographically is directly dependent on the resolution capability of the projection lens, wherein the resolution capability of the projection lens is inversely proportional to the wavelength of the exposure light. Therefore, it is advantageous to use electromagnetic radiation from the short-wave range of the optical spectrum as exposure light. Nowadays it is possible to use ultraviolets (UV) light, in particular vacuum ultraviolet (VUV) light, as exposure light having a wavelength of 193 nm. The prior art also discloses microlithographic systems which use extreme ultraviolet (EUV) light having a wavelength of approximately 7 nm or 13.5 nm as exposure light. It is noted that the term "microlithography" should be understood broadly and generally relates not only to structure sizes in the range of less than 1 mm, but also in the range of less than 1 μm. In particular, microlithography even encompasses structure sizes in the nanometres range.

However, the use of UV, VUV and EUV light often leads to optical imaging aberrations, which are attributable for example to heating of the optical elements in the projection lens. The heating is therefore associated with the fact that the photonic energy of the exposure light is inversely proportional to the wavelength thereof. Consequently, optical elements are loaded by high heat input when light having short wavelengths is used, which leads to the impairment of the optical properties of the optical element, for example of the refractive indices, the reflection coefficients or the transmission coefficients of optical elements. The imaging aberrations caused thereby include monochromatic imaging aberrations such as spherical aberrations, astigmatism, coma, image field curvature and distortion. Chromatic imaging aberrations, such as transverse chromatic aberrations and longitudinal chromatic aberrations, can also arise as a result of such overheating.

In microlithographic processes, in order to increase the resolution it is often desirable for a plurality of successive exposure processes to be carried out. In this case, for the exposure quality it is crucial for the exposed structures of the successive exposure processes to be aligned highly accurately with respect to one another. This is accompanied by an increase in the desired accuracy behavior of the lateral structure positioning.

Furthermore, it is of importance to align the image plane of the projection lens with the photoresist as accurately as possible, in order to counteract telecentricity errors, for example, in which the exposure location varies in the light propagation direction. Telecentricity errors unavoidably lead to lateral image position variations that have an adverse effect on the exposure accuracy.

In addition to the causes mentioned above, unevennesses of the semiconductor substrate surface coated with the photoresist also lead to impairments of the imaging quality. This usually involves photoresist applied by spin coating, which has a non-uniform thickness owing to the application process. In order to compensate for the influences of such unevennesses, an accurate adaptation of the focal position of the projection lens to the substrate surface is desirable.

Against this background, optical wavefront manipulators are used to manipulate wavefronts of the exposure light and thereby to effect a correction of the aberrations. By way of example, an optical wavefront manipulator is known from DE 10 2013 204 391 B3, the optical wavefront manipulator having a manipulator surface whose surface shape and/or refractive index distribution are/is reversibly variable. A wavefront manipulation for dynamically influencing the wavefront of the exposure light rays is thus possible. A further example of an optical wavefront manipulator includes a plurality of movable positive-negative aspheres. The prior art furthermore discloses optical wavefront manipulators which have a facet mirror including a plurality of mirror facets which in each case are movable by an actuator system along at least one spatial direction and/or are tiltable about at least one axis.

In order that the optical wavefront manipulator functions with the high reliability for microlithography, a reliable measurement of wavefronts is of great importance. On the basis of the measured wavefront, the optical wavefront manipulator is correspondingly set in order to realize desired aberration corrections. The prior art discloses an interferometric wavefront measuring method that is suitable for determining telecentricity, distortion, coma and/or image shell aberrations. Moreover, it is known that a Moiré grating arrangement of the type mentioned in the introduction can be used for determining telecentricity errors.

SUMMARY

Known wavefront measuring devices can be affected by the disadvantage that the wavelength measurement is time-consuming. Increased loss of throughput and reduced exposure efficiency occur as a result. Moreover, imaging aberrations are not identified rapidly enough, and so setting errors of the optical wavefront manipulator cannot be eliminated near-instantaneously or completely.

The present disclosure seeks to develop a projection exposure apparatus of the type mentioned in the introduction to the effect that it enables a wavefront measurement with increased speed and reduced loss of throughput with the measurement accuracy at least remaining the same in order to be able to realize a reliable and at the same time highly efficient wavefront manipulation.

The disclosure provides a projection exposure apparatus that includes a projection lens, an optical wavefront manipulator for manipulating a wavefront in the projection lens, and a wavefront measuring device for measuring a wavefront in the projection lens. The wavefront measuring device includes a Moiré grating arrangement having an object grating and an image grating which are designed to be arranged in an object plane and an image plane, respectively, of the projection lens. The object grating and the image grating are coordinated with one another in a manner true to scale in such a way as to generate a Moiré superimposition pattern from an imaging of the object grating onto the image plane and the image grating. The Moiré grating arrangement is designed in such a way as to simultaneously generate the Moiré superimposition pattern for a plurality of field points of an object field in the object plane and/or of an image field in the image plane. The optical wavefront manipulator interacts with the wavefront measuring device in such a way that the optical wavefront manipulator is controllable on the basis of at least one measurement result of the wavefront measuring device. The wavefront manipulator corrects a wavefront in the projection lens in order to optimize the imaging performance of the projection lens. The wavefront manipulator is configured to be controlled in a closed-loop.

The wavefront measuring device of the projection exposure apparatus according to the disclosure is suitable for interacting with the microlithographic projection lens which images structures on a reticle situated in the object plane onto a photoresist-coated substrate surface in the image plane. By virtue of the fact that the object grating is arranged in the object plane and the image grating is arranged in the image plane, the object grating can be imaged onto the image plane by the projection lens. The resultant imaging of the object grating is referred to as an aerial image and is superimposed with the image grating, which is likewise situated in the image plane and which serves as a reference grating of the aerial image. Since the object grating and the image grating are coordinated with one another in a manner true to scale, the aerial image—apart from possible imaging aberrations—is also coordinated with the image grating in a manner true to scale. The superimposition of the aerial image with the image grating results in a Moiré superimposition pattern, which is dependent on the optical properties of the projection lens. Specifically, this means that all imaging aberrations associated with the optical properties of the projection lens are transferred to the resulting Moiré superimposition pattern. The imaging aberrations of the projection lens can be deduced by subsequent detection and/or analysis of the Moiré superimposition pattern.

In this case, it is possible to generate the Moiré superimposition pattern for at least two field points of the object field and/or of the image field. Consequently, the wavefront measuring device according to the disclosure makes it possible to carry out a wavefront measurement simultaneously at a plurality of field points of the object field and/or of the image field.

Advantageously, via the wavefront measuring device, the wavefront can be measured with a high accuracy, which is intrinsic to the Moiré technique, and at the same time a high efficiency, since measurement is not carried out at each individual wave point at different times. The loss of throughput in the exposure is reduced as a result. Since a wavefront measurement usually takes place in exposure pauses, the duration of the exposure pauses can thus be shortened.

Furthermore, the wavefront measuring device of the projection exposure apparatus according to the disclosure is advantageous for a near-field manipulation of the wavefront, since the optical wavefront manipulator can be efficiently controlled or regulated in the projection lens on the basis of the detected Moiré superimposition pattern. On account of the simplicity and robustness of the Moiré technique, the present disclosure is therefore particularly advantageous with regard to a simplified and reliable wavefront manipulation.

Further, the wavefront manipulator is closed-loop operated.

Within the scope of the present disclosure, the wavefront measuring device can be configured to only measure a part of the wavefront, especially lower orders of Zernike polynomials and in particular distortion and/or defocus, rather than the whole wavefront or higher order Zernike polynomials, as it is the case with interferometric wavefront measuring devices.

In one preferred configuration, the plurality of field points is a finite number of defined field points of the object field and/or of the image field.

The number of defined field points can be as large as possible. This measure enables the wavefront measurement simultaneously over a large portion of or even the entire object and/or image field of the projection lens. Advantageously, via a single wavefront measurement it is possible to infer imaging aberrations of the projection lens for the entire object and/or image field.

In a further preferred configuration, the imaging of the object grating and/or the image grating are/is rotatable about an angle with respect to an optical axis of the projection lens.

This measure enables the setting of the angle between the grating orientation of the aerial image and the grating orientation of the image grating, wherein the object grating and/or the projection lens can be rotated relative to the image grating for this purpose. An aerial image that is correspondingly rotated relative to the image grating arises depending on the rotation angle. Via rotation angles set in a targeted manner, imaging aberrations can advantageously be examined with regard to their rotational symmetries on the basis of the generated Moiré superimposition pattern.

In a further preferred configuration, the generated Moiré superimposition pattern arises as a result of an at least partially coherent superimposition of the imaging of the object grating onto the image plane with the image grating.

This measure makes it possible to carry out a wavefront measurement even in the case of a partial incoherence between the object grating and the image grating without any loss of quality in the wavefront measurement. Advantageously, the robustness and in association therewith also the reliability of the wavefront measurement are increased.

In a further preferred configuration, the Moiré grating arrangement has a diffraction grating wherein the imaging of the object grating has an interference of at least two different orders of diffraction generated by the diffraction grating.

This measure takes account of diffraction effects which occur in the exposure process and influence the imaging quality. Advantageously, those imaging aberrations of the projection lens for which diffraction effects are relevant can thereby be "stored" in the Moiré superimposition pattern.

In a further preferred configuration, the object grating and/or the image grating have/has a plurality of grating lines running "radially".

The grating lines running radially serve for generating a Moiré contrast image. This measure advantageously enables a wavefront measurement with a particularly high structure resolution capability.

In a further preferred configuration, the object grating and/or the image grating have/has a plurality of grating cells having an alternating cell orientation.

Via the alternating cell orientation, optical properties of the projection lens which have a direction dependence in a plane running transversely with respect to the optical axis of the projection lens, can concomitantly be taken into account in the generated Moiré superimposition pattern. Consequently, preferably via the choice of the cell orientation of the grating cells, different imaging aberrations which are associated with the above direction-dependent optical properties of the projection lens can be taken into account in a simple manner.

In a further preferred configuration, a grating structure of the object grating and/or of the image grating has a periodically linear and/or a periodically two-dimensional grating structure.

Via the periodic grating structure, imaging aberrations of the projection lens, in particular distortions, become visible particularly clearly in the Moiré superimposition pattern, which corresponds to an advantageously increased sensitivity of the wavefront measurement. With the aid of the linear and/or two-dimensional grating structure, imaging aberrations can optionally be detected in the Moiré superimposition pattern.

In a further preferred configuration, the wavefront measuring device includes an evaluation unit for detecting the generated Moiré superimposition pattern in order to determine an imaging aberration of the projection lens from the pattern.

This measure makes it possible to deduce an imaging aberration, for example distortion, of the projection lens from the generated Moiré superimposition pattern. Advantageously, the determination of the imaging aberration is particularly simple and efficient.

In a further preferred configuration, the evaluation unit is designed to determine a contrast image, an intensity distribution, a phase distribution, an image field curvature, astigmatism, and/or a distortion of the generated Moiré superimposition pattern.

With the aid of this measure, the wavefront measuring device of the projection exposure apparatus according to the disclosure is able to carry out a quantitative examination of the projection lens with regard to the imaging aberrations thereof. This advantageously enables a particularly reliable aberration correction for the projection lens or a particularly reliable setting correction for the optical wavefront manipulator.

In a further preferred configuration, the wavefront measuring device includes a fluorescence element disposed directly downstream of the image grating.

The fluorescence element serves for optically amplifying the generated Moiré superimposition pattern. Advantageously, the Moiré superimposition pattern can thus be detected with increased accuracy, such that the result of the wavefront measurement is particularly reliable.

In a further preferred configuration, the wavefront measuring device includes a defocusing system for defocusing the imaging of the object grating and/or for defocusing the image grating.

Via the defocusing system according to the disclosure, a defocusing of the aerial image and/or of the image grating can be realized in a targeted manner such that imaging aberrations that are normally difficult to detect, such as image field curvatures and/or intrinsic defocussings by the projection lens, are advantageously taken into account.

In a further preferred configuration, the wavefront has an aberration in at least one of the Zernike orders Z2, Z3, Z4, Z5 and Z6.

The Zernike orders (or Zernike coefficients) are used in microlithography to characterize aberrations, wherein the complexity of the aberration increases with the Zernike order. At the same time it is known that aberrations of low Zernike orders are more unstable and more susceptible to fluctuation than aberrations of higher Zernike orders. On account of the rapidity of the Moiré technique used, the present disclosure advantageously enables a reliable wavefront measurement despite unstable or fluctuation-susceptible imaging aberrations of the projection lens.

In a further preferred configuration, the wavefront measuring device is designed in such a way as to measure wavefronts having an aberration in at least one Zernike order from Z2, Z3 Z4, Z5 and Z6 via a field-resolved focus stagger measurement and/or an interferometric measurement.

This measure enables a combined measurement technique for the wavefront measurement. Advantageously, the advantages of the field-resolved focus stagger measurement and/or of the interferometric measurement can be supplemented by the abovementioned and further advantages of the Moiré technique.

The projection lens interacts with the wavefront measuring device according to one or more of the configurations described above and/or includes the wavefront measuring device. The projection lens can be used in the projection exposure apparatus, in particular in UV and/or EUV microlithography, and can preferably be integrated into the apparatus.

The optical wavefront manipulator for manipulating a wavefront in the projection lens interacts with the wavefront measuring device according to one or more of the configurations described above in such a way that the optical wavefront manipulator is controllable on the basis of at least one measurement result of the wavefront measuring device.

The wavefront manipulator can be arranged in an intermediate image within the projection lens or in vicinity of such an intermediate image.

The projection exposure apparatus according to the disclosure includes an optical wavefront manipulator and a wavefront measuring device according to one or more of the configurations described above, wherein the wavefront manipulator, on the basis of an interaction of the optical wavefront manipulator with the wavefront measuring device, corrects a wavefront in the projection lens in order to optimize the imaging performance of the projection lens.

A method according to the disclosure for operating a projection exposure apparatus includes iteratively optimizing the setting of the optical wavefront manipulator, wherein the projection exposure apparatus includes the optical wavefront manipulator and the wavefront measuring device according to one or more of the configurations described above, wherein iteratively optimizing includes the following method steps: measuring a wavefront via the wavefront measuring device, evaluating the result of the wavefront measurement, and setting the optical wavefront manipulator on the basis of the evaluation.

In this way, the wavefront measuring device is used as an in-situ measurement technique which, in interaction with the optical wavefront manipulator, monitors and optimizes the imaging performance of the projection lens preferably during the operation thereof. By way of example, wavefront aberrations which are attributable to the heating of lens elements situated in the projection lens are corrected as a result. Advantageously, imaging aberrations of the projection lens are detected and corrected particularly rapidly.

Manipulating the wavefront is preferably performed in a closed loop.

Further advantages and features will become apparent from the following description and the accompanying drawing.

It goes without saying that the features mentioned above and those yet to be explained below can be used not only in the combination respectively indicated, but also in other combinations or by themselves, without departing from the scope of the present disclosure.

BRIEF DESCRIPTION OF THE DRAWINGS

Exemplary embodiments are illustrated in the drawings and described hereinafter with reference thereto. In the drawings.

DESCRIPTION OF EXEMPLARY EMBODIMENTS

Figure 11:
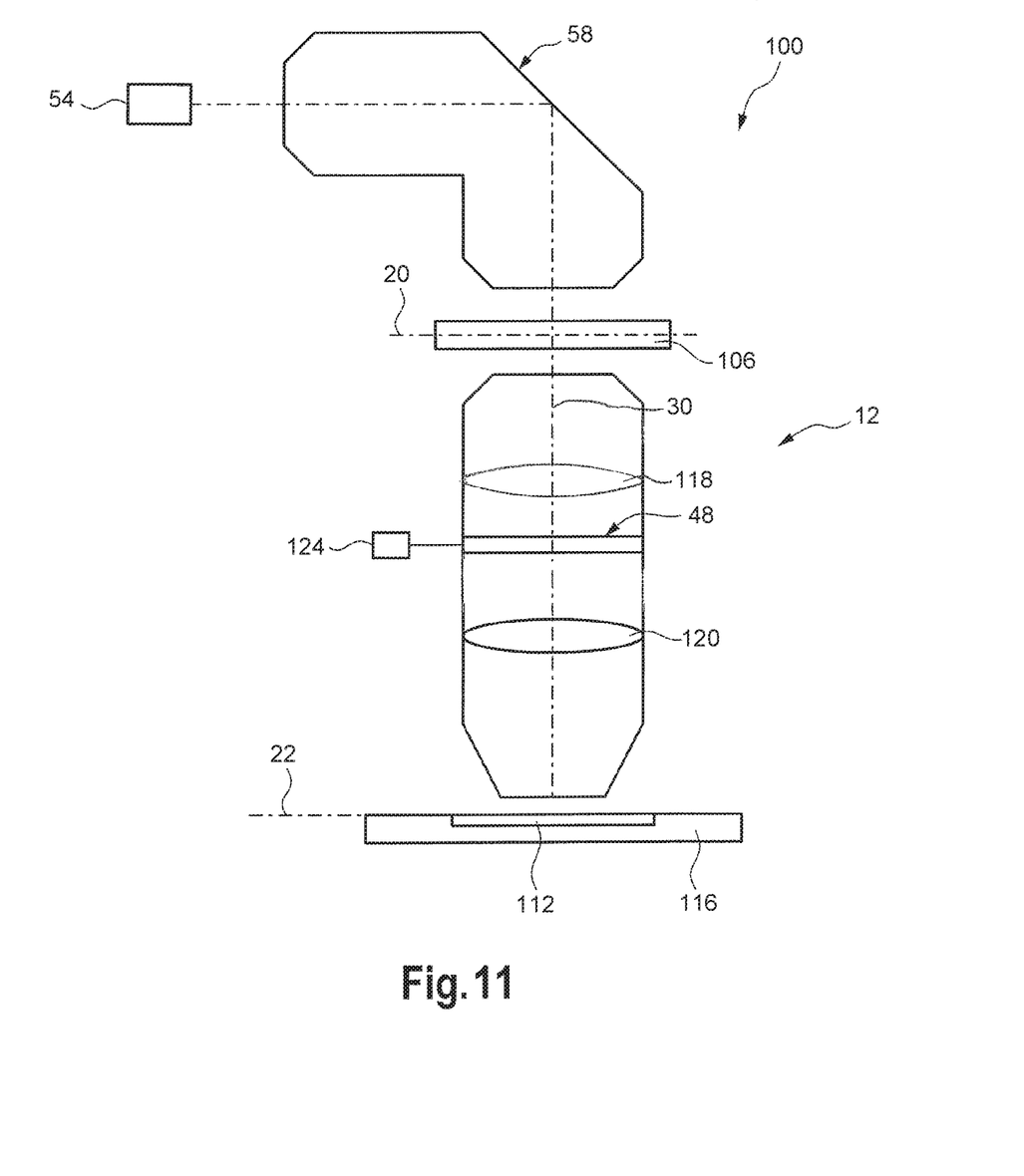
FIG. 11 shows a schematic drawing of a projection exposure apparatus.

With reference first to FIG. 11, a projection exposure apparatus 100, for example a lithography stepper or scanner will be described.

The projection exposure apparatus includes a light source 54 for generating illumination light, for example in the UV, VUV or EUV spectral range, and an illumination unit 58. The illumination unit 58 guides the light from the light source 54 to a reticle 106, which is arranged in an object plane 20 of a projection lens 12. The reticle 106 includes a pattern of fine structures which are imaged by the projection lens 12 onto a substrate or wafer 112 arranged in an image plane 22, whereby the wafer is exposed with light from the source 54. The wafer 112 is supported on a wafer stage 116. The projection lens 110 includes a plurality of optical elements like lenses and/or mirrors, wherein two lenses 118 and 120 are shown exemplarily. It is to be understood that the number of optical elements in the projection lens 12 is higher than two in praxis. Further shown in FIG. 11 is a wavefront manipulator 48 for manipulating a wavefront in the projection lens 12 for optimizing imaging quality of the projection lens 12. A controller or actuator 124 controls or actuates the manipulator 48. The manipulator 48 can include one or more optical elements, which can be displaced in direction of an optical axis 30, and/or perpendicular to the axis 30. Other examples of manipulators 48 include deformable optical elements and/or optical elements which can be heated/cooled in order to manipulate the wavefront.

In the following, further aspects of the projection exposure apparatus 110 will be described, in particular embodiments of wavefront measuring devices for use in the projection exposure apparatus 110 which can interact with the wavefront manipulator 48.

Figure 1:
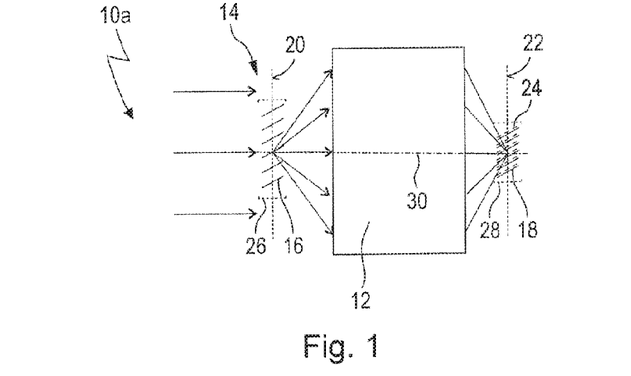
FIG. 1 shows a schematic illustration of a wavefront measuring device in accordance with one exemplary embodiment.

FIG. 1 shows a wavefront measuring device, which is provided in general with the reference sign 10a, in a highly schematic illustration that is not true to scale. The wavefront measuring device 10a serves for measuring a wavefront in the projection lens 12 and includes a Moiré grating arrangement 14 having an object grating 16 and an image grating 18. The object grating 16 is arranged in the object plane 20 of the projection lens 12, wherein the image grating 18 is arranged in the image plane 22 of the projection lens 12.

As is shown in FIG. 1, light rays (shown illustratively as arrows) pass through the object grating 16 and the projection lens 12 before they reach the image grating 18 in the image plane 22. In this case, the object grating 16 is imaged by the projection lens 12 onto the image plane 22 as an aerial image 24, which is shown illustratively by dashed lines. It goes without saying that the light rays are illustrated highly schematically and not in a manner true to scale. Furthermore, it goes without saying that the aerial image 24 shown here is likewise highly schematic.

In the exemplary embodiment shown here, the object grating 16 and the image grating 18 in each case have a grating structure composed of a plurality of lines running obliquely relative to the object plane 20 and image plane 22, respectively. The object grating 16 and the image grating 18 are coordinated with one another in a manner true to scale. This means that the grating structure of the object grating 16 and the grating structure of the image grating 18 differ from one another only in their scale such that the aerial image 24 of the object grating 16 is superimposed with the image grating 18 in the image plane 22 to form a Moiré superimposition pattern.

In the object plane 20, the object grating 16 defines an object field 26, wherein the image grating 18 defines an image field 28 in the image plane 22. It is noted that the projection lens 12, the object plane 20, the image plane 22, the object field 26 and the image field 28 are illustrated as dashed lines in order to clarify that these components and planes are not structural parts of the wavefront measuring device 10a, but rather merely interact with the latter.

Both the object field 26 and the image field 28 have a plurality of field points, each of which is assigned at least one wavefront of the light passing through the object grating 16, the projection lens 12 and/or the image grating 18. Furthermore, the Moiré grating arrangement 14 is designed in such a way that a wavefront measurement can be carried out simultaneously at a plurality, preferably at a large number of defined field points of the object field 26 and/or of the image field 28. This takes place by virtue of the fact that the Moiré superimposition pattern is generated simultaneously for at least two field points, preferably for a larger number of the field points, of the object field 26 and/or of the image field 28. With the aid of the Moiré superimposition pattern generated as a result, conclusions can be drawn about the optical properties of the projection lens 12, in order, if appropriate, to identify imaging aberrations of the projection lens 12 or to implement correction measures.

Figures 2A, 2B, 2C:
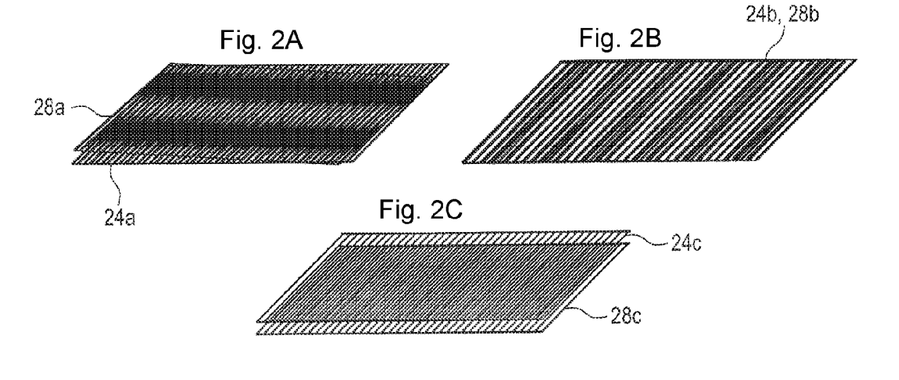
FIGS. 2A-C show a schematic illustration of a Moiré superimposition pattern in accordance with a further exemplary embodiment.

FIG. 2 shows three exemplary Moiré superimposition patterns which respectively arise as a result of the superimposition of an aerial image 24a-c with an image field 28a-c.

In FIG. 2A, the aerial image 24a and the image field 28a have in each case a substantially periodic grating structure, wherein the two grating structures are slightly rotated relative to one another with respect to an optical axis 30 of the projection lens 12 shown in FIG. 1. As is evident in FIG. 2A, a Moiré superimposition pattern in the form of a bright elongate stripe arranged between two dark elongate stripes arises from the superimposition of the aerial image 24a with the image field 28a. The longitudinal direction of the stripes is directed substantially perpendicular to the grating lines of the aerial image 24a and of the image field 28a, respectively. Such a Moiré superimposition pattern is referred to as a rotation Moiré.

FIG. 2B shows a further Moiré superimposition pattern, which is referred to as a scale Moiré. The periods of the grating structures of the aerial image 24b and of the image field 28b differ slightly from one another. In other words, the grating structures of the aerial image 24b and of the image field 28b have different "scales", wherein the grating structures are not rotated relative to one another. The resultant Moiré superimposition pattern has a plurality of stripes which are substantially parallel to the grating lines and alternate between bright and dark.

In FIG. 2C, the grating structures of the aerial image 24c and of the image field 28c are not rotated relative to one another, nor do they have different periods. The resulting Moiré superimposition pattern, in contrast to the examples shown in FIGS. 2A, B, has no stripes alternating between bright and dark. This involves a uniform or regular Moiré superimposition pattern, the intensity of which, in particular over time, can be changed or tuned. For this purpose, one of the two gratings is displaced in a direction perpendicular to the grating lines, in particular laterally.

The examples shown in FIGS. 2A-C are not necessarily complete with respect to all Moiré superimposition patterns that can be generated, and serve only for schematically elucidating the present disclosure. Depending on the Moiré superimposition pattern generated, it is possible to ascertain whether and to what extent the projection lens 12 deviates from its desired functionality, such that a change in the setting of the imaging properties of the projection lens 12 can be realized in a targeted manner.

Figure 3:
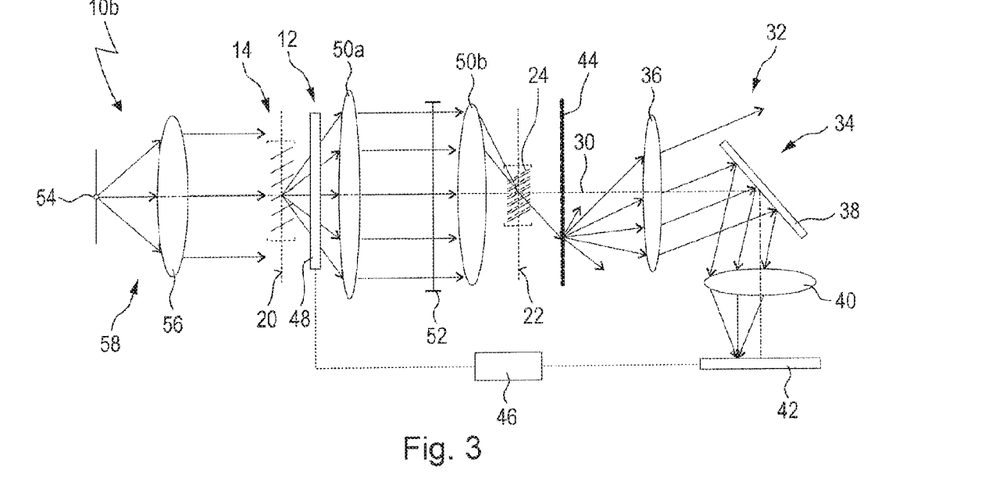
FIG. 3 shows a schematic Meridional section of a wavefront measuring device in a projection exposure apparatus in accordance with a further exemplary embodiment.

FIG. 3 shows a further exemplary embodiment of a wavefront measuring device 10b for use in the projection exposure apparatus 110, which, in addition to the components shown in FIG. 1, includes an evaluation unit 32, which serves for detecting the generated Moiré superimposition pattern. In the exemplary embodiment shown here, the evaluation unit 32 includes a detection optical unit 34 including a first lens element 36, a mirror 38 and a second lens element 40, and also a camera 42. The evaluation unit 32 is disposed downstream of the Moiré grating arrangement 14 along the optical axis 30 of the projection lens 12. In this case, the mirror 38 is disposed downstream of the first lens element 36, the second lens element 40 is disposed downstream of the mirror 38, and the camera 42 is disposed downstream of the second lens element 40 in the light propagation direction. The evaluation unit 32 serves to determine an imaging aberration of the projection lens 12 from the generated Moiré superimposition pattern. In the exemplary embodiment shown, furthermore, a fluorescence element 44, in particular a fluorescence layer, is arranged between the Moiré grating arrangement 14 and the evaluation unit 32. The fluorescence element 44 serves for optically amplifying the generated Moiré superimposition pattern, such that the latter can be detected by the evaluation unit 32 with an image quality adequate for microlithography.

It goes without saying that the evaluation unit 32 and the fluorescence element 44 shown in FIG. 3 merely represent one of many possible configurations of the wavefront measuring device 10b. By way of example, the evaluation unit 32 in accordance with a further exemplary embodiment can have a different number of optical elements (lens element, mirror, prism, . . . etc.). The arrangement of the optical components of the evaluation unit 32 can also vary, depending on the exemplary embodiment. In accordance with a further exemplary embodiment, a different luminescence element, for example a phosphorescence layer, can also be used instead of a fluorescence element.

The camera 42 is connected via a control unit 46 to the optical wavefront manipulator 48 in terms of signalling via lines—illustrated as dashed lines. The imaging aberration of the projection lens 12 as determined by the evaluation unit 32 is received by the control unit 46, which generates a corresponding control signal on the basis of the imaging aberration determined and transmits it to the optical wavefront manipulator 48. Consequently, the wavefront measuring device 10b is able to alter the setting of the optical wavefront manipulator 48 on the basis of the result of the wavefront measurement such that the imaging aberrations are counteracted. In accordance with a further exemplary embodiment, the camera 42 includes a CCD camera, wherein other types of cameras or photodetectors, for example CMOS photodetectors, photodiodes and/or phototransistors are likewise conceivable. The wavefront manipulator 48 can be operated or controlled in a closed loop.

The optical wavefront manipulator 48 and the wavefront measuring device 10b can be provided in the lithography stepper or scanner 110, wherein the wavefront manipulator 48, on the basis of an interaction of the optical wavefront manipulator 48 with the wavefront measuring device 10b corrects a wavefront in the projection lens 12 in order to optimize the imaging performance of the projection lens 12. In particular, the wavefront manipulator 48 can be arranged in an intermediate image or in vicinity of an intermediate image of the projection lens 12.

In accordance with a further exemplary embodiment, the change in the setting of the optical wavefront manipulators 48 is carried out iteratively with the aid of the wavefront measuring device 10b. This means that per iteration a wavefront measurement is effected, the result of which is subsequently evaluated by the evaluation unit, wherein the control unit 46 transmits a corresponding control signal to the optical wavefront manipulator 48 on the basis of the result of the evaluation. This iterative process can be carried out until the optical wavefront manipulator 48 acquires its desired setting and the projection lens 12 attains its desired imaging quality.

The projection lens 12 includes further optical elements in addition to the optical wavefront manipulator 48, wherein only an object-side lens element 50a, an image-side lens element 50b and one stop 52 arranged between the object-side lens element 50a and the image-side lens element 50b are shown here for simplification. It goes without saying that the number and/or the arrangement of optical elements of the projection lens 12 can vary depending on the exemplary embodiment. In the exemplary embodiment shown, the optical wavefront manipulator 48 is arranged in proximity to the object field 20, although this should not be understood to be restrictive for the present disclosure. In principle, an arrangement of the optical wavefront manipulators 48 in proximity to the image field 22, or in an intermediate image of the projection lens 12, is also conceivable.

The reticle 106 and the substrate 112, which are arranged in the object plane 20 and the image plane 22, respectively, during the operation of a microlithographic system, in particular of the projection exposure apparatus 110 including the projection lens 12, are not shown in FIG. 3 and FIG. 1. It is noted that the Moiré grating arrangement 14 can be used for wavefront measurement both in the case where the reticle and/or the substrate are/is incorporated into the projection exposure apparatus, and in the opposite case.

In the exemplary embodiment shown here, the entering light rays emerge from the light source 54 and are collimated via a collimator 56 before the light rays reach the object grating 16. The collimator 56 is part of the illumination optical unit 58, wherein the illumination optical unit 58 shown here is merely by way of example.

Figure 4:
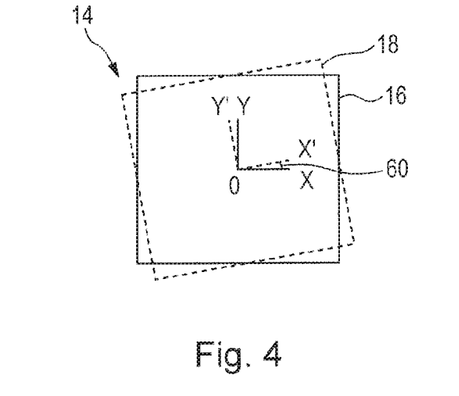
FIG. 4 shows a schematic illustration of a Moiré grating arrangement in accordance with a further exemplary embodiment.

FIG. 4 shows a further exemplary embodiment of the Moiré grating arrangement 14, in which the grating orientation of the object grating 16 is rotatable relative to the grating orientation of the image grating 18 by an angle 60 with respect to the optical axis 30 of the projection lens 12. The grating orientation of object grating 16 is represented illustratively by an x- and a y-axis in a two-dimensional Cartesian coordinate system in FIG. 4, wherein the optical axis 30 of the projection lens 12 runs through the origin O perpendicular to a plane spanned by the x-axis and the y-axis. The grating orientation of the image grating 18 is represented illustratively by an x'- and a y'-axis in a second two-dimensional Cartesian system, rotated relative to the first Cartesian system, wherein the x-axis is rotated relative to the x'-axis, firstly, and the y-axis is rotated relative to the y'-axis, secondly, by the angle 60 in relation to the origin O.

In accordance with one exemplary embodiment, the angle 60 can be set with an accuracy of 1°, 0.1° and/or 0.01°. In accordance with a further exemplary embodiment, an automatic angular setting is integrated in the iterative setting change process mentioned above, such that not just one but a plurality of successive Moiré measurements are carried out per iteration, wherein the angle 60 is increased and/or decreased by a predefinable increment between adjacent Moiré measurements. In accordance with a further exemplary embodiment, the increment for the angle 60 is an integral multiple of 15°, preferably 45, 60°, 90° or 180°.

Figure 5:
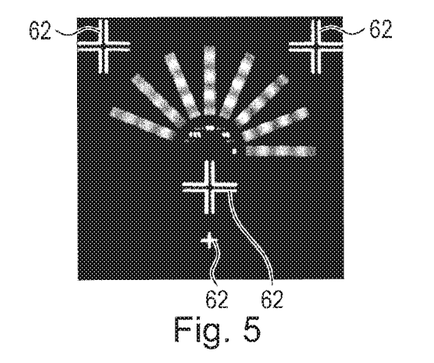
FIG. 5 shows a schematic illustration of a grating structure of a Moiré grating arrangement in accordance with a further exemplary embodiment.

FIG. 5 shows a further Moiré superimposition pattern, in which the object grating 16 and/or the image grating 18 have/has a plurality of rectangular grating segments, the short sides of which are arranged along two concentric circles. Consequently, the object grating 16 and/or the image grating 18 have/has linear grating lines running tangentially. The Moiré superimposition pattern arises as a result of slight detuning of the grating periods of both linear gratings, as shown in FIG. 2B. Imaging aberrations having an order of magnitude in the submillimetre and/or micrometre range, can be taken into account. In the exemplary embodiment shown here, the object grating 16 and/or the image grating 18 are/is additionally provided with a plurality of double crosses 62, which serve for relative alignment between the object grating 16 and the image grating 18.

Figure 6A:
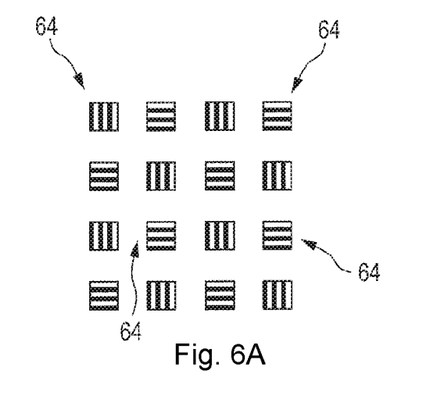
FIG. 6A shows a schematic illustration of a grating structure of a Moiré grating arrangement in accordance with a further exemplary embodiment.
Figure 6B:
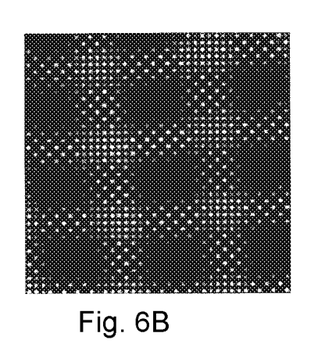
FIG. 6B shows a schematic illustration of a Moiré superimposition pattern associated with the Moiré grating arrangement in FIG. 6A.

FIG. 6A shows a further exemplary embodiment of the Moiré grating arrangement 14, in which the object grating 16 and/or the image grating 18 have/has a plurality of grating cells 64 having an alternating cell orientation. In the exemplary embodiment shown here, each grating cell 64 has a plurality of vertical or horizontal stripes alternating between bright and dark. The cell orientation alternates from vertical to horizontal, or vice versa, between adjacent grating cells 64. The corresponding Moiré superimposition pattern is shown in FIG. 6B, wherein a plurality of cross-grating-like pattern structures composed of crossing and additively overlapping bright and dark stripes can be discerned. In accordance with a further exemplary embodiment, the cell orientation changes between adjacent grating cells 64 by an angle that is different from 90°, preferably 45° and/or 135°. Advantageously, it is thereby possible to measure a wavefront having an aberration in at least one of the Zernike orders Z5 and Z6.

Figure 7A:
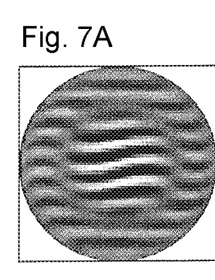
FIGS. 7A-C show a schematic illustration of a Moiré superimposition pattern in accordance with a further exemplary embodiment with integrated defocusing.
Figure 7B:
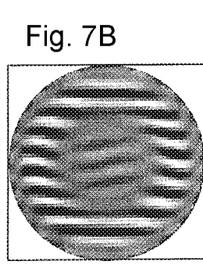
Figure 7C:
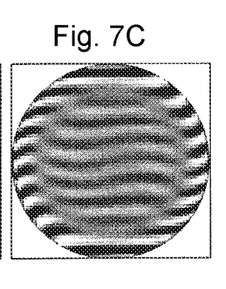

FIGS. 7A-C show three Moiré contrast images in which a progressive defocusing of the aerial image 24 and/or of the image grating 18 via a defocusing system is activated. In the case of the Moiré measurement for FIG. 7A, the defocusing is vanishingly small, wherein a low-contrast ring extending from the edge of the Moiré contrast image in the direction towards the image centre can be seen. In the case of the Moiré measurement for FIG. 7B, a defocusing of 1.5 μm is activated. The resulting Moiré contrast image has a thin low-contrast ring at the edge and a circular low-contrast region in the image centre, which is at a distance from the low-contrast ring. In the case of the Moiré measurement for FIG. 7C, a defocusing of 2.5 μm is activated, such that in the Moiré contrast image a circular low-contrast region around the image centre can be discerned. From FIG. 7A to FIG. 7C, the focus of the Moiré contrast image changes from the image centre via the image field zone to the image edge. Proceeding from such Moiré contrast images, a series of imaging aberrations, for example the profile of image field curvatures, can be determined in a simple manner.

FIGS. 7A-C each show that imaging aberrations of the projection lens 12 and/or erroneous configurations of the Moiré superimposition pattern 14 can be ascertained via defocusings activated in a targeted manner.

As explained in connection with FIG. 4, it is possible to examine optical aberrations of the projection lens 12 with regard to their symmetry properties on the basis of a plurality of Moiré superimposition patterns of the same Moiré grating arrangement 14. This is shown below by way of example in FIG. 8.

Figure 8:
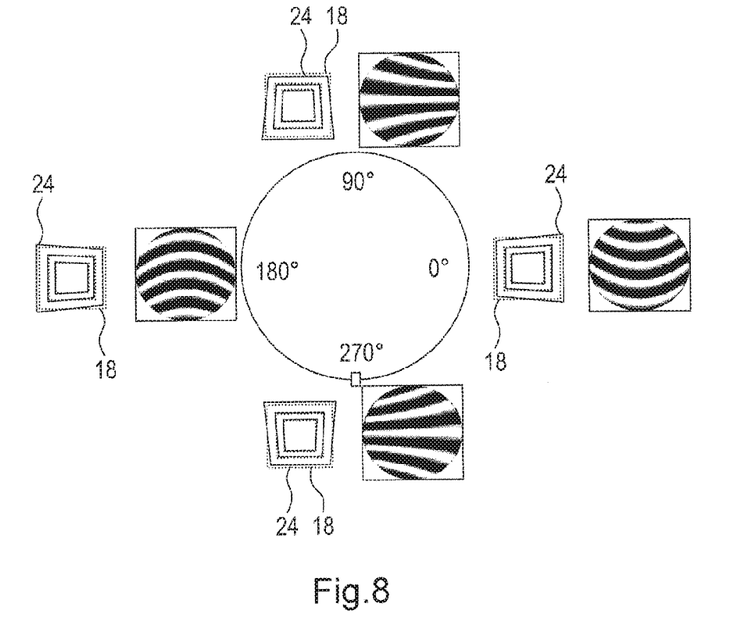
FIG. 8 shows a schematic illustration of a plurality of Moiré superimposition patterns in accordance with a further exemplary embodiment in the case of a non-rotationally symmetrical aberration of the wavefront.

FIG. 8 reveals four Moiré superimposition patterns, in the case of which the aerial image 24 (illustrated as a solid line) and the image grating 18 (illustrated as dashed lines) are rotated relative to one another by an angle with respect to the optical axis 30 (FIG. 1, FIG. 2). The angle is 0°, 90°, 180° and 270°, respectively. In accordance with one exemplary embodiment, the setting of the angle is realized by the rotation of the object grating 16 relative to the image grating 18 with respect to the optical axis 30. In accordance with a further exemplary embodiment, the angular setting is realized by the rotation of the projection lens about the optical axis 30.

Each Moiré superimposition pattern has curved stripes that alternate between bright and dark. This is associated with the fact that the aerial image 24 is beset by a distortion that is attributable to an impairment of the optical properties of the projection lens. In the case of a rotationally symmetrical distortion, the Moiré measurement yields a Moiré superimposition pattern that is independent of the angle between the aerial image 24 and the image grating 18. In contrast to rotationally symmetrical distortions, the Moiré measurement in the case of non-rotationally symmetrical distortions, as shown in FIG. 8, yields a Moiré superimposition pattern that behaves differently depending on the angle between the aerial image 24 and the image grating 18.

Figure 9A:
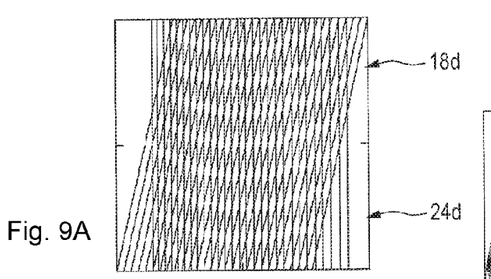
FIGS. 9A-B show a schematic illustration of a Moiré superimposition pattern of a Moiré grating arrangement having a linear grating structure in accordance with a further exemplary embodiment.
Figure 9B:
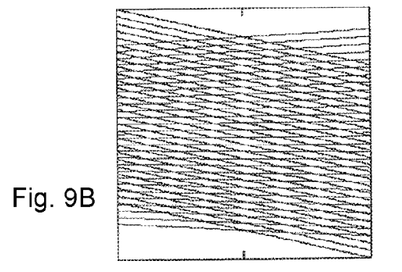

The Moiré grating arrangement 14 can be designed in different ways. FIG. 9A shows an aerial image 24$d$ of a periodically one-dimensional object grating, wherein the aerial image 24$d$ is superimposed by a periodically one-dimensional image grating 18$d$ with a grating orientation slightly rotated relative to the aerial image 24$d$. In this case, arcuate stripes alternating between bright and dark arise, the stripes extending substantially horizontally in the schematic illustration shown here. A similar Moiré superimposition pattern is shown in FIG. 9B, in the case of which the curved stripes alternating between bright and dark run substantially vertically in the schematic illustration shown here. The Moiré grating arrangements from FIG. 9A and FIG. 9B are referred to as cross gratings. It is noted that the term "Moiré grating arrangement" relates to grating arrangements including in each case at least one object grating and/or at least one aerial image, on the one hand, and at least one image grating, on the other hand.

Figure 9C:
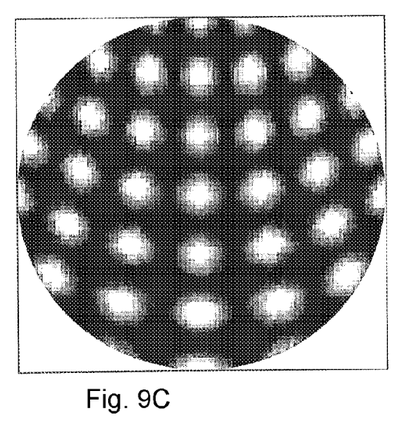
FIG. 9C shows a schematic illustration of a Moiré superimposition patterns of a Moiré grating arrangement having a two-dimensional grating structure in accordance with a further exemplary embodiment.

FIG. 9C shows a Moiré superimposition pattern from a Moiré grating arrangement 14 consisting of two cross gratings. This involves a periodically two-dimensional grating structure that results from the additive sum of the two grating structures shown in FIG. 9A and FIG. 9B Consequently, the Moiré superimposition pattern shown in FIG. 9C is a superimposition of the two Moiré superimposition patterns shown in FIG. 9A and FIG. 9B.

Figure 10A:
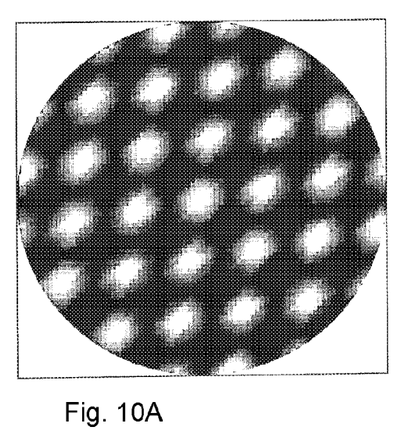
FIGS. 10A-B show a schematic illustration of a Moiré superimposition pattern of a Moiré grating arrangement having a two-dimensional grating structure in accordance with a further exemplary embodiment, wherein the object grating is rotated relative to the image grating.
Figure 10B:
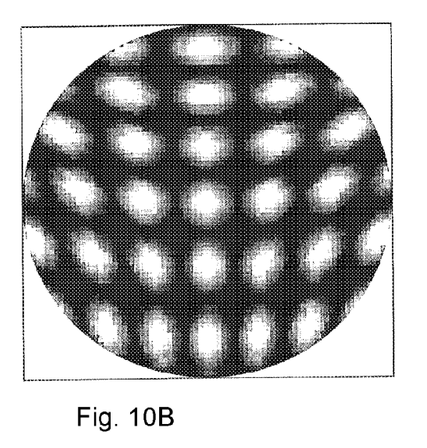

FIG. 10 shows two further examples of Moiré superimposition patterns, in the case of which the respective aerial image 24 and the respective image field 28 are rotated relative to one another and have a periodically two-dimensional grating structure. With the aid of the Moiré interferograms obtained as a result, the projection lens 12 can be examined simply and accurately with regard to possible imaging aberrations, for example anamorphism and/or three-wave figure. It is noted that the term "Moiré interferogram" should not be understood in a strictly physical sense, but rather relates to Moiré superimposition patterns whose appearance is similar to typical patterns of interferences.

In accordance with a further exemplary embodiment, the wavefront measuring device 10$a$, $b$ enables a combination of Moiré measurements and a different type of wavefront measurement, for example a field-resolved focus stagger measurement and/or an interferometric measurement. Consequently, the advantages of the respective measurement methods can be combined in order to increase the accuracy and reliability of the wavefront measurement. In accordance with a further exemplary embodiment, a field-resolved focus stagger measurement is combined with a Moiré measurement, wherein the field-resolved measurement is carried out for a wavefront having an aberration in the Zernike order Z4, while the Moiré measurement of the wavefront is carried out at a plurality, preferably all, of the field points of the object field 26 and/or of the image field 28.

In accordance with a further exemplary embodiment, a Moiré measurement is combined with an interferometric measurement, there being omitted on the reticle a plurality of regions for measurement markers of the interferometric measurement within the object grating 16 and/or the image grating 18. This measure leads to increased robustness of the wavefront measurement, wherein a certain loss of information within field profiles, in particular within long-wave field profiles, can be tolerated without a loss of quality in the wavefront measurement.

In accordance with a further exemplary embodiment, the generated Moiré superimposition pattern arises as a result of an at least partially incoherent superimposition of the aerial image 24 with the image grating 16. In interferometric wavefront measurement methods known from the prior art, a strictly coherent superimposition, in particular a superimposition within the coherence length, is desirable in order that interference patterns arise. In comparison therewith, via the present disclosure, a reliable wavefront measurement is possible even in the absence of coherence between the aerial image 24 and the image grating 16.

In accordance with a further exemplary embodiment, the Moiré grating arrangement 14 includes a diffraction grating. The diffraction grating serves for generating different orders of diffraction of the entering light, which are imaged onto the image plane 22 and interfere with one another. The aerial image 24 results from the interference of the orders of diffraction involved.

In accordance with a further exemplary embodiment, the evaluation unit 32 is designed to determine at least one of the following imaging aberrations: rotationally symmetrical distortion, non-rotationally symmetric distortion, coma, defocusing, image field curvature, banana shape (continuous image field curvature). For this purpose, the evaluation unit 32 can determine a series of physical variables, for example a contrast distribution and/or intensity distribution, a phase shift, a brightness distribution, etc., on the basis of the generated Moiré superimposition pattern.

In accordance with a further exemplary embodiment, a Moiré contrast distribution and/or a Moiré phase are/is determined via averaging a product intensity over a period. In this case, an intensity distribution of the aerial image 24 is multiplied by an intensity distribution of the image grating 16, the product being integrated over a grating period of the aerial image 24. Finally, the integral result is divided by the grating period of the aerial image 24. The resultant Moiré intensity distribution is proportional to the sum of the number 1 and a further summand containing a product of a Moiré contrast distribution and the cosine of a Moiré phase angle. Consequently, at least one of the two physical variables: the Moiré contrast distribution and the Moiré phase can be determined. Finally, the distortion of the projection lens 12 can be determined from the Moiré phase determined.

The above method for determining the phase shift has an accuracy that is limited by disturbance effects, for example harmonic effects. In order to increase the accuracy of the Moiré phase determination, a series of measures can be implemented. By way of example, one of the following measures can be used: Use of multi-step formulae, use of Moiré grating arrangements having even smaller grating structures, use of piezo-tables, setting of broad-colour Moiré superimposition patterns, spatial convolution and/or filtering, use of multi-stripe methods, etc.

In accordance with a further exemplary embodiment, the Moiré grating arrangement 14 has a chequered grating. This measure has the advantage that the Moiré stripes of the generated Moiré superimposition pattern exhibit a rotation, for example by 45°, even in the case of rotationally symmetrical distortions. This is associated with the fact that no orders of diffraction exist along the x- and/or y-axis of the object field 26 and/or of the image field 28. This measure therefore enables a particularly sensitive detection method for optical aberrations of the projection lens.

In accordance with a further exemplary embodiment, the Moiré grating arrangement 14 has at least one chequered grating having a two-dimensional grating structure. Such a Moiré grating arrangement makes it possible to generate a multi-stripe Moiré superimposition pattern with particularly high accuracy.

What is claimed is:

1. An apparatus, comprising:
   a projection lens having an object plane and an image plane;
   an optical wavefront manipulator configured to manipulate a wavefront in the projection lens; and
   a wavefront measuring device configured to measure a wavefront in the projection lens,
   wherein:
   the wavefront measuring device comprises a Moiré grating arrangement comprising an object grating and an image grating;
   the object grating is in the object plane;
   the image grating is in the image plane;
   the object and image gratings are configured to generate a Moiré superimposition pattern via an imaging of the object grating onto the image plane and the image grating;
   the Moiré grating arrangement is configured to simultaneously generate the Moiré superimposition pattern for a plurality of field points of an object field in the object plane and/or of an image field in the image plane;
   the optical wavefront manipulator is controllable on the basis of at least one measurement result of the wavefront measuring device;
   the wavefront manipulator is configured to correct a wavefront in the projection lens;
   the wavefront manipulator is configured to be controlled in a closed-loop; and
   the apparatus is a microlithography projection exposure.

2. The apparatus of claim 1, wherein the plurality of field points comprises a finite number of defined field points of the object field and/or of the image field.

3. The apparatus of claim 2, wherein the image of the object grating and/or the image grating are/is rotatable about an angle with respect to an optical axis of the projection lens.

4. The apparatus of claim 3, wherein the object grating and/or the image grating comprises a plurality of grating lines running radially.

5. The apparatus of claim 4, wherein the object grating and/or the image grating comprises a plurality of grating cells having an alternating cell orientation.

6. The apparatus of claim 5, wherein a grating structure of the object grating and/or of the image grating has a periodically linear and/or a periodically two-dimensional grating structure.

7. The apparatus of claim 6, further comprising a defocusing system configured to defocus the image of the object grating and/or for defocus the image grating.

8. The apparatus of claim 1, wherein the Moiré superimposition pattern arises as a result of an at least partially coherent superimposition of the imaging of the object grating onto the image plane with the image grating.

9. The apparatus of claim 1, wherein the Moiré grating arrangement further comprises a diffraction grating, and the imaging of the object grating comprises an interference of at least two different orders of diffraction generated by the diffraction grating.

10. The apparatus of claim 1, further comprising an evaluation unit configured to detect the Moiré superimposition pattern to determine an imaging aberration of the projection lens from the pattern.

11. The apparatus of claim 10, wherein the evaluation unit is configured to determine a contrast image, an intensity distribution, a phase distribution, an image field curvature, astigmatism, and/or a distortion of the Moiré superimposition pattern.

12. The apparatus of claim 1, further comprising a fluorescence element directly downstream of the image grating.

13. The apparatus of claim 1, wherein the wavefront comprises an aberration in at least one of the Zernike orders Z2, Z3, Z4, Z5 and Z6.

14. The apparatus of claim 1, wherein the wavefront measuring device is configured to measure wavefronts comprising an aberration in at least one Zernike order from Z2, Z3 Z4, Z5 and Z6 via a field-resolved focus stagger measurement and/or an interferometric measurement.

15. The apparatus of claim 1, wherein the wavefront manipulator is configured to correct a wavefront in the projection lens to optimize an imaging performance of the projection lens.

16. The apparatus of claim 1, further comprising an illumination unit.

17. A method, comprising:
   providing the apparatus of claim 1;
   iteratively optimizing a setting of the optical wavefront manipulator, each iteration comprising:
      measuring a wavefront by means of the wavefront measuring device;
      evaluating the result of the wavefront measurement; and
      setting the optical wavefront manipulator on the basis of the evaluation.

18. The method of claim 17, wherein the optical wavefront manipulator is controlled in a closed loop.

19. An apparatus, comprising:
a projection lens having an object plane and an image plane;
an optical wavefront manipulator; and
a wavefront measuring device,
wherein:
- the wavefront measuring device comprises a Moiré grating arrangement comprising an object grating in the object plane and an image grating in the image plane;
- the object and image gratings are configured to generate a Moiré superimposition pattern via an imaging of the object grating onto the image plane and the image grating;
- the Moiré grating arrangement is configured to simultaneously generate the Moiré superimposition pattern for a plurality of field points of an object field in the object plane and/or of an image field in the image plane;
- the optical wavefront manipulator is controllable on the basis of at least one measurement result of a wavefront by the wavefront measuring device;
- the wavefront manipulator is configured to correct a wavefront in the projection lens; and
- the wavefront manipulator is configured to be controlled in a closed-loop.

20. The apparatus of claim 19, wherein the apparatus is a microlithography projection exposure apparatus.

* * * * *

UNITED STATES PATENT AND TRADEMARK OFFICE
CERTIFICATE OF CORRECTION

PATENT NO. : 10,012,911 B2
APPLICATION NO. : 15/618395
DATED : July 3, 2018
INVENTOR(S) : Michael Arnz et al.

Page 1 of 1

It is certified that error appears in the above-identified patent and that said Letters Patent is hereby corrected as shown below:

In the Specification

Column 1, Line 16, delete "herein" and insert -- herein. --.

Column 6, Line 38, delete "Z3" and insert -- $Z_3$, --.

Column 12, Line 19, delete "45," and insert -- 45°, --.

In the Claims

Column 16, Claim 14, Line 50, delete "Z3" and insert -- $Z_3$, --.

Signed and Sealed this
Nineteenth Day of March, 2019

Andrei Iancu
*Director of the United States Patent and Trademark Office*